United States Patent
Kwon et al.

(10) Patent No.: US 8,093,932 B2
(45) Date of Patent: Jan. 10, 2012

(54) POWER-ON RESET SIGNAL GENERATION CIRCUIT OF SEMICONDUCTOR MEMORY APPARATUS

(75) Inventors: Jae Kwan Kwon, Ichon-si (KR); Sang Hwa Chung, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 44 days.

(21) Appl. No.: 12/650,954

(22) Filed: Dec. 31, 2009

(65) Prior Publication Data

US 2011/0128053 A1      Jun. 2, 2011

(30) Foreign Application Priority Data

Nov. 30, 2009   (KR) .................. 10-2009-0117000

(51) Int. Cl.
*H03L 7/00*          (2006.01)
(52) U.S. Cl. ........................................... 327/143
(58) Field of Classification Search ................ None
See application file for complete search history.

(56) References Cited

U.S. PATENT DOCUMENTS

| | | | |
|---|---|---|---|
| 7,196,950 B2 | 3/2007 | Kanda et al. | |
| 7,466,172 B2 * | 12/2008 | Liu | ................................ 327/143 |
| 7,533,253 B2 | 5/2009 | Jo | |
| 2006/0152991 A1 | 7/2006 | Cho et al. | |
| 2007/0277027 A1 | 11/2007 | Kim et al. | |
| 2008/0313418 A1 | 12/2008 | Kwon et al. | |

FOREIGN PATENT DOCUMENTS

| | | |
|---|---|---|
| JP | 2003-162453 | 6/2003 |
| KR | 100791075 B1 | 12/2007 |
| KR | 10-2008-0108871 A | 12/2008 |

* cited by examiner

*Primary Examiner* — Lincoln Donovan
*Assistant Examiner* — Daniel Rojas
(74) *Attorney, Agent, or Firm* — William Park & Associates Ltd.

(57) ABSTRACT

A power-on reset signal generation circuit of a semiconductor memory apparatus includes an external voltage level detector configured to detect an external voltage and generate an external voltage detection signal; a band gap voltage generation unit configured to generate a band gap voltage in response to the external voltage detection signal; a level detection voltage dividing unit configured to divide the external voltage depending upon a level of the band gap voltage and generate a division voltage; and a power-on reset signal generation unit configured to compare the level of the band gap voltage with a level of the division voltage and generate a power-on reset signal.

7 Claims, 6 Drawing Sheets

POWER-ON RESET SIGNAL GENERATION CIRCUIT OF SEMICONDUCTOR MEMORY APPARATUS

CROSS-REFERENCE TO RELATED APPLICATION

The present application claims priority under 35 U.S.C. §119(a) to Korean Application No. 10-2009-0117000, filed on Nov. 30, 2009, in the Korean Intellectual Property Office, which is incorporated herein by reference in its entirety as if set forth in full.

BACKGROUND OF THE INVENTION

1. Technical Field

Various embodiments of the present disclosure generally relate to a semiconductor integrated circuit, and more particularly, to a power-on reset signal generation circuit of a semiconductor memory apparatus.

2. Related Art

A semiconductor memory apparatus is driven by an applied external voltage. When the semiconductor memory apparatus is driven by the external voltage, the semiconductor memory apparatus is configured to not operate until a level of the external voltage is identical to or greater than a target voltage level. This prevents the semiconductor memory apparatus from functioning improperly at an external voltage level less than the target voltage level.

In general, a semiconductor memory apparatus has a circuit (a power-on reset signal generation circuit) for driving the internal circuits of the semiconductor memory apparatus when the external voltage level becomes identical to or greater than the target voltage level.

Figure 1:
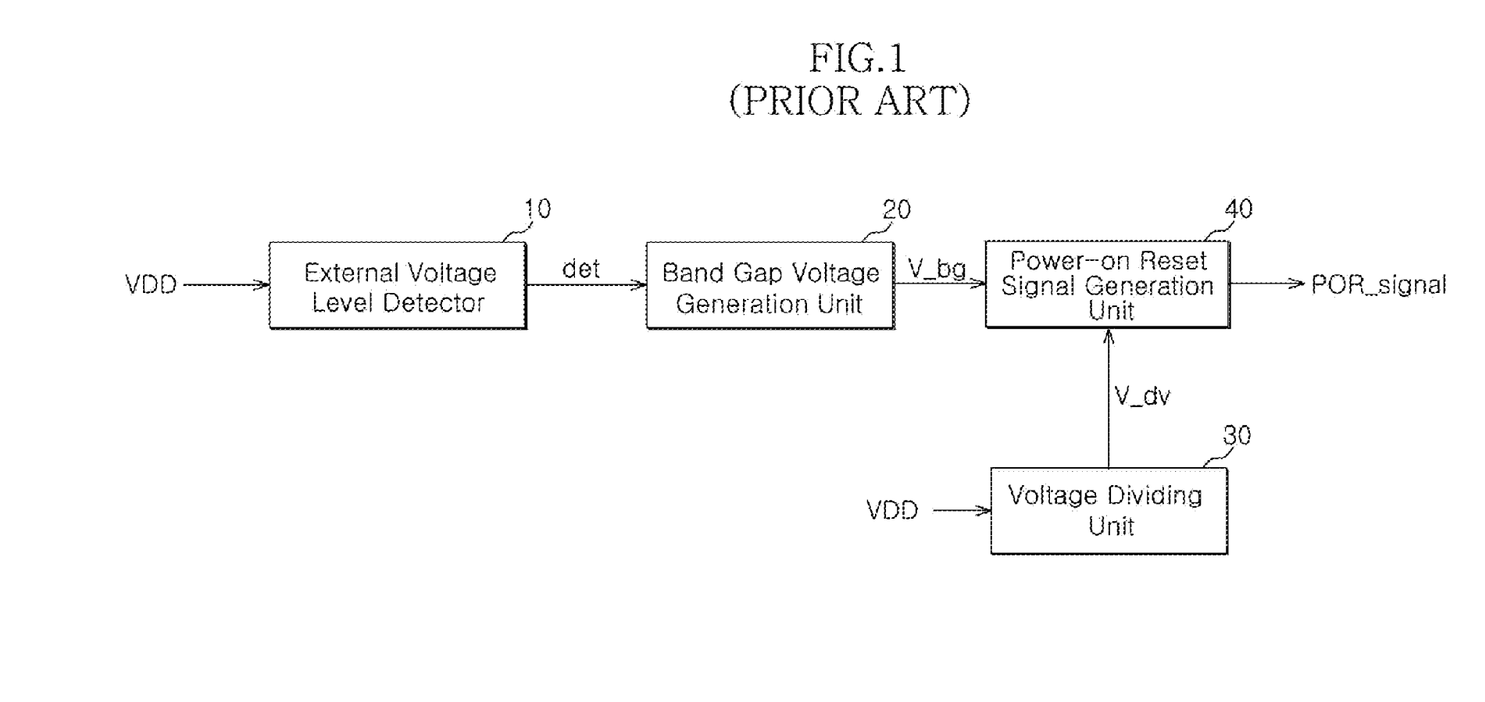
FIG. 1 is a diagram of a typical power-on reset signal generation circuit of a semiconductor memory apparatus.

Referring to FIG. 1, a typical power-on reset signal generation circuit of a semiconductor memory apparatus comprises an external voltage level detector 10, a band gap voltage generation unit 20, a voltage dividing unit 30, and a power-on reset signal generation unit 40.

The external voltage level detector 10 detects the level of an external voltage VDD and generates a detection signal det. For example, the external voltage level detector 10 enables the detection signal det when the external voltage VDD has a level identical to or greater than a target voltage level.

The band gap voltage generation unit 20 generates a band gap voltage V_bg when the detection signal det is enabled. The band gap voltage generation circuit 20 may be, for example, a typical band gap circuit. The band gap voltage generation unit 20 is designed in such a manner that the target voltage level of the band gap voltage V_bg is less than the target voltage level of a division voltage V_dv.

The voltage dividing unit 30 divides the external voltage VDD and generates the division voltage V_dv.

The power-on reset signal generation unit 40 compares the division voltage V_dv with the band gap voltage V_bg and generates a power-on reset signal POR_signal.

Exemplary operations of the power-on reset signal generation circuit of the conventional semiconductor memory apparatus as discussed above, are described with reference to FIG. 2.

Figure 2:
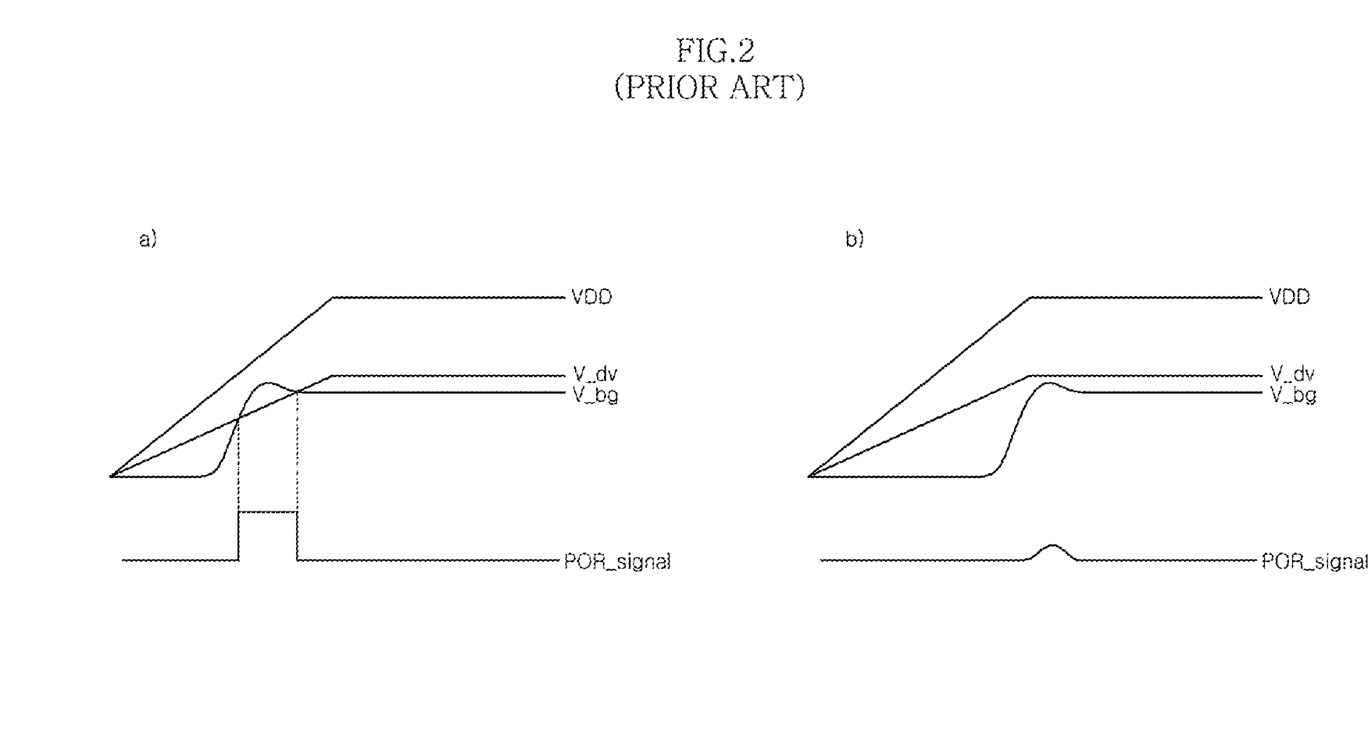
FIG. 2 is a timing diagram of the typical power-on reset signal generation circuit of a semiconductor memory apparatus shown in FIG. 1.

As the external voltage VDD is applied to the semiconductor memory apparatus, the level of the external voltage VDD rises to a preset voltage level. During the rising interval of the level of the external voltage VDD, when the level of the external voltage VDD is identical to or greater than the target voltage level, the detection signal det is enabled.

If the detection signal det is enabled, the band gap voltage V_bg is generated. The band gap voltage V_bg also rises to a predetermined voltage level.

Referring to FIG. 2, in a typical case a), when the level of the division voltage V_dv is higher than the level of the band gap voltage V_bg, the power-on reset signal POR_signal is disabled to a low level. Also, when the level of the division voltage V_dv is lower than the level of the band gap voltage V_bg, the power-on reset signal POR_signal is enabled to a high level.

In the typical case a), when the level of the external voltage VDD is identical to or greater than the target voltage level, the power-on reset signal POR_signal is enabled to a high level, is maintained at the enabled state, and is disabled to a low level.

In a non-typical case b), as the timing at which the band gap voltage V_bg is generated becomes slower than the typical case a), there is no such case that the level of the band gap voltage V_bg is higher than the level of the division voltage V_dv. Thus, the power-on reset signal POR_signal comprises a glitch component as shown in the drawing.

If the power-on reset signal POR_signal is generated as the glitch component, the power-on reset signal POR_signal is likely to disappear before it is transferred to internal circuits.

As a result, in the non-typical case b), because the power-on reset signal POR_signal is not transferred to the internal circuits, the internal circuits cannot be driven. That is to say, this causes an initial driving error of the semiconductor memory apparatus.

SUMMARY OF THE INVENTION

Various aspects of the present invention comprise a power-on reset signal generation circuit of a semiconductor memory apparatus which can prevent an initial driving error from occurring in a semiconductor memory apparatus.

In one aspect of the present invention, a power-on reset signal generation circuit of a semiconductor memory apparatus comprises an external voltage level detector configured to detect an external voltage and generate an external voltage detection signal; a band gap voltage generation unit configured to generate a band gap voltage in response to the external voltage detection signal; a level detection voltage dividing unit configured to divide the external voltage depending upon a level of the band gap voltage and generate a division voltage; and a power-on reset signal generation unit configured to compare the level of the band gap voltage with a level of the division voltage and generate a power-on reset signal.

In another aspect of the present invention, a power-on reset signal generation circuit of a semiconductor memory apparatus comprises a power-on reset signal generation unit configured to compare a band gap voltage with a division voltage and generate a power-on reset signal; and a level detection voltage dividing unit configured to generate the division voltage by dividing an external voltage in response to a level of the band gap voltage.

In another aspect of the present invention, a power-on reset signal generation circuit of a semiconductor memory apparatus comprises a level detection voltage dividing unit configured to generate a division voltage when a level of a band gap voltage is higher than a target level, wherein a result of comparing the level of the band gap voltage and a level of the division voltage is outputted as a power-on reset signal.

In another aspect of the present invention, a power-on reset signal generation circuit of a semiconductor memory apparatus comprises a voltage dividing unit configured to divide an external voltage and generate a division voltage; and a power-on reset signal generation unit configured to compare a level of a band gap voltage with a level of division voltage and generate a power-on reset signal when an enable signal is enabled and the level of the band gap voltage is higher than a target level.

In another aspect of the present invention, a power-on reset signal generation circuit of a semiconductor memory apparatus comprises a detection signal generation unit configured to generate a drop detection signal that transits to a level of a band gap voltage or a level of a ground voltage in response to the level of the band gap voltage; a driving unit configured to drive a drop detection signal and generate a band gap detection signal that transits to a level of an external voltage or the level of the ground voltage; a signal response type voltage dividing unit configured to divide the external voltage in response to the band gap detection signal and generate a division voltage; and a power-on reset signal generation unit configured to compare the level of the band gap voltage with a voltage of the division voltage and generate a power-on reset signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Advantages and characteristics of the present invention and a method for achieving them will be apparent with reference to embodiments described below in addition with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 3:
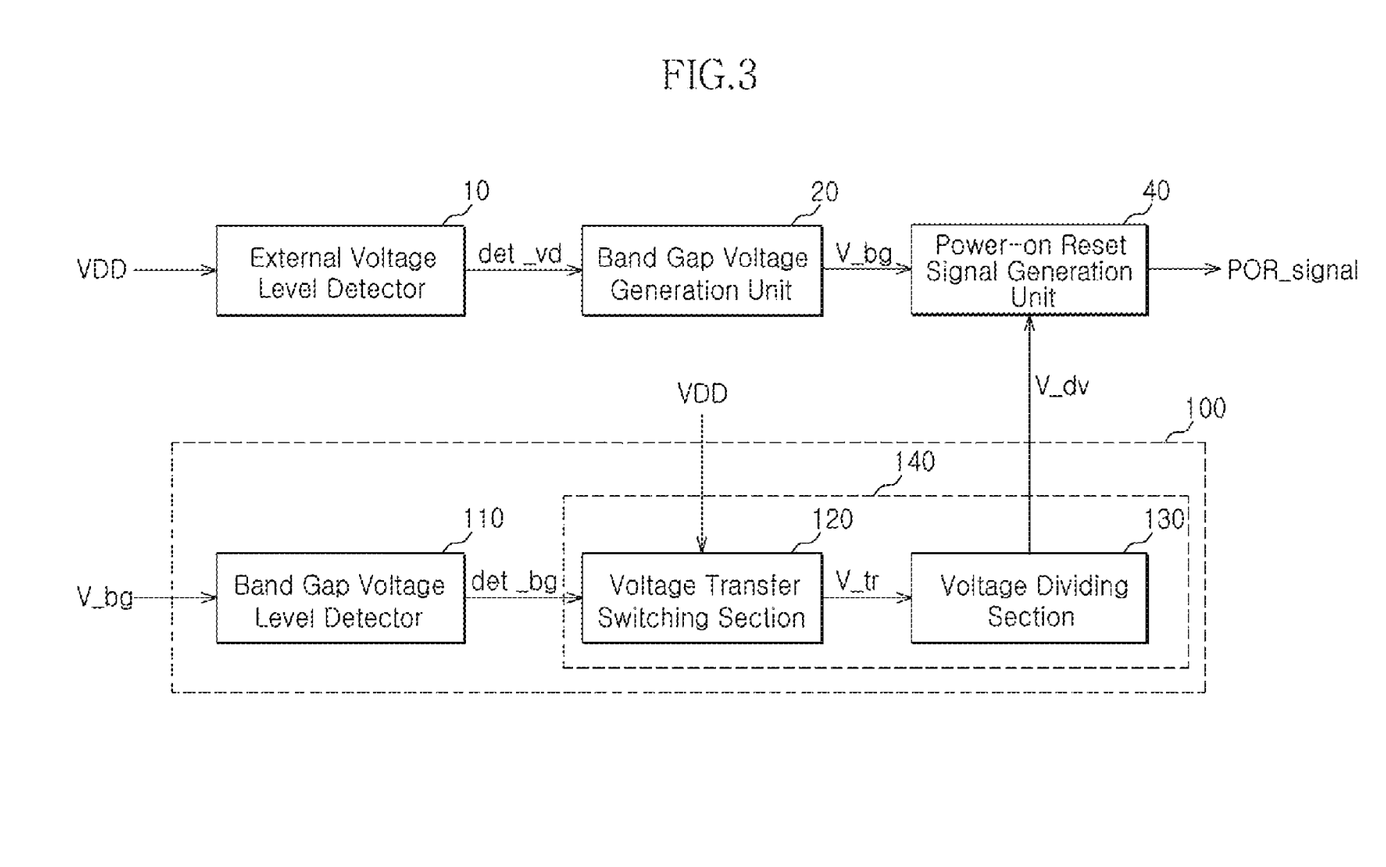
FIG. 3 is a diagram schematically illustrating a power-on reset signal generation circuit of a semiconductor memory apparatus in accordance with one embodiment of the present invention.

Referring to FIG. 3, a power-on reset signal generation circuit in accordance with one embodiment of the present invention comprises an external voltage level detector 10, a band gap voltage generation unit 20, a power-on reset signal generation unit 40, and a level detection voltage dividing unit 100.

The external voltage level detector 10 detects an external voltage VDD and generates a detection signal det_vd. For example, the external voltage level detector 10 enables the detection signal det_vd when the level of the external voltage VDD is identical to or greater than a target voltage level.

The band gap voltage generation unit 20 generates a band gap voltage V_bg when the detection signal det_vd is enabled. The band gap voltage generation unit 20 may be, for example, a typical band gap circuit. Preferably, the band gap voltage generation unit 20 is designed in such a manner that the target voltage level of the band is gap voltage V_bg is less than the target voltage level of a division voltage V_dv.

The power-on reset signal generation unit 40 compares the division voltage V_dv with the band gap voltage V_bg and generates a power-on reset signal POR_signal. For example, the power-on reset signal generation unit 40 enables the power-on reset signal POR_signal when the band gap voltage V_bg is higher than the division voltage V_dv, and disables the power-on reset signal POR_signal when the band gap voltage V_bg is lower than the division voltage V_dv.

The level detection voltage dividing unit 100 divides the external voltage VDD depending upon the level of the band gap voltage V_bg and generates the division voltage V_dv. For example, the level detection voltage dividing unit 100 divides the external voltage VDD and generates the division voltage V_dv when the band gap voltage V_bg has a voltage level identical to or greater than the target voltage level.

The level detection voltage dividing unit 100 comprises a band gap voltage level detector 110, a voltage transfer switching section 120, and a voltage dividing section 130.

The band gap voltage level detector 110 enables a band gap detection signal det_bg when the band gap voltage V_bg has a voltage level identical to or greater than the target voltage level.

The voltage transfer switching section 120 outputs the external voltage VDD as a transfer voltage V_tr in response to the is band gap detection signal det_bg. For example, the voltage transfer switching section 120 outputs the external voltage VDD as the transfer voltage V_tr when the band gap detection signal det_bg is enabled, and suppresses the external voltage VDD from being outputted as the transfer voltage V_tr when the band gap detection signal det_bg is disabled.

The voltage dividing section 130 divides the transfer voltage V_tr and generates the division voltage V_dv. At this time, since the voltage transfer switching section 120 and the voltage dividing section 130 divide or do not divide the external voltage VDD in response to the band gap detection signal det_bg, they may be referred to as a signal response type voltage dividing block.

Figure 4:
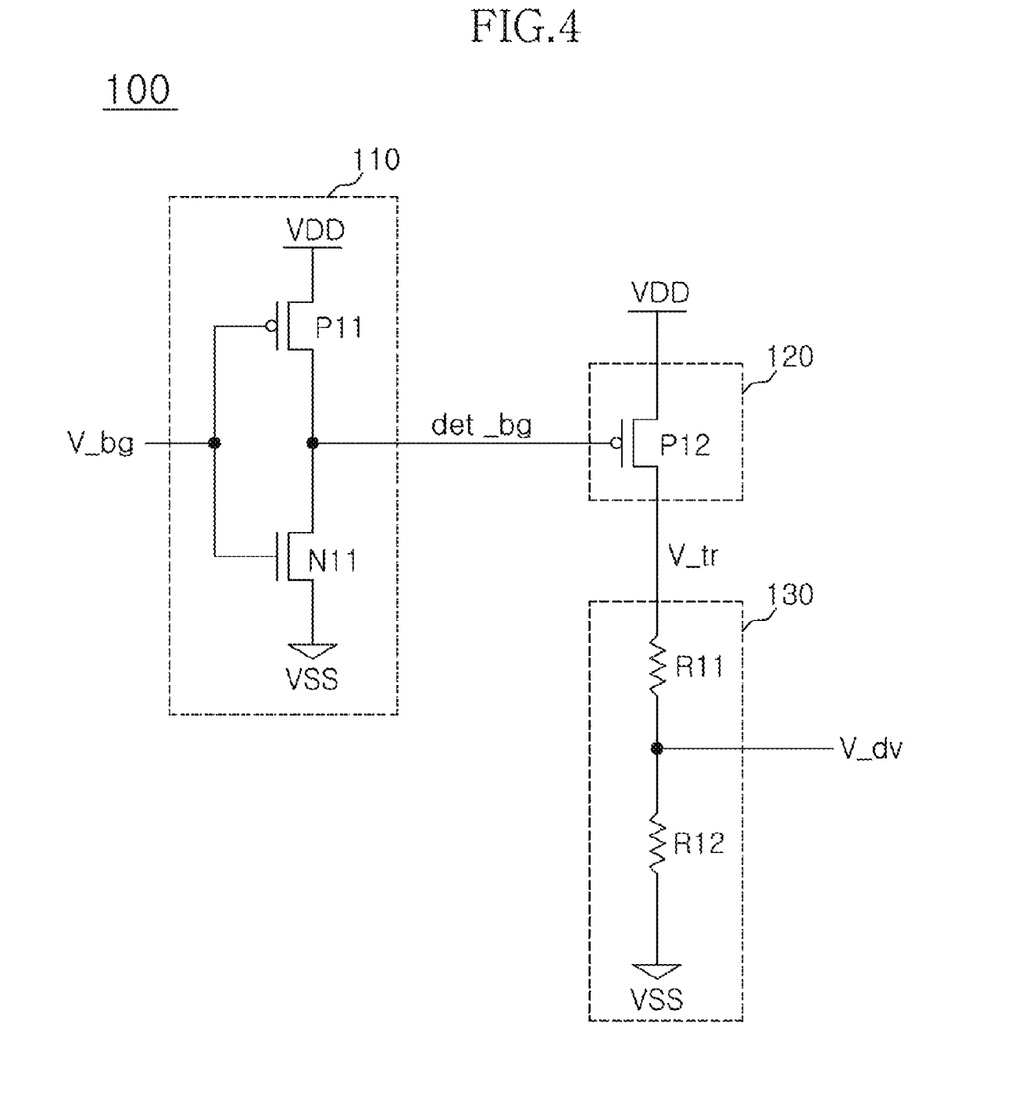
FIG. 4 is a diagram showing a configuration of a level detection voltage dividing unit shown in FIG. 3.

Referring to FIG. 4, a band gap voltage level detector 110 comprises first and second transistors P11 and N11. The first transistor P11 has a gate which is inputted with the band gap voltage V_bg, and a source which is applied with the external voltage VDD. The second transistor N11 has a gate which is inputted with the band gap voltage V_bg, a drain to which the drain of the first transistor P11 is connected, and a source to which a ground terminal VSS is connected. At this time, the band gap detection signal det_bg is outputted from a node to which the first transistor P11 and the second transistor N11 are connected.

Referring to FIG. 4, the voltage transfer switching section 120 comprises a third transistor P12. The third transistor P12 has a gate which is inputted with the band gap detection signal det_bg, a is source to which the external voltage VDD is applied, and a drain from which the transfer voltage V_tr is outputted.

Referring to FIG. 4, the voltage dividing section 130 comprises first and second resistors R11 and R12. The first resistor R11 has one end to which the transfer voltage V_tr is applied. The second resistor R12 has one end to which the other end of the first resistor R11 is connected and the other end to which the ground terminal VSS is connected. The division voltage V_dv is outputted from a node to which the first resistor R11 and the second resistor R12 are connected.

Figure 5:
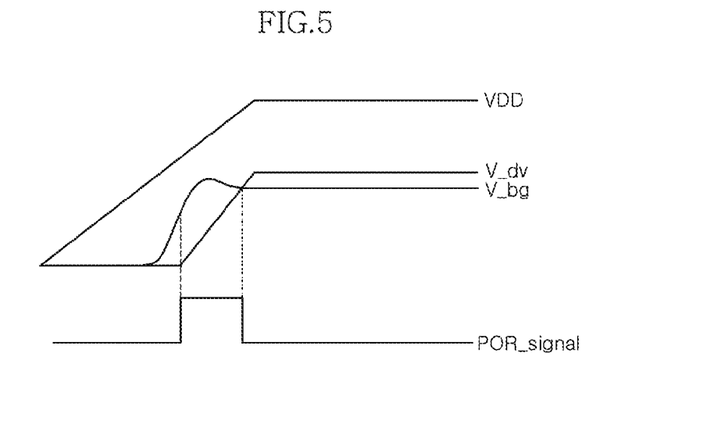
FIG. 5 is a timing diagram of the power-on reset signal generation circuit of a semiconductor memory apparatus in accordance with one embodiment of the present invention.

Exemplary operations of the power-on reset signal generation circuit of a semiconductor memory apparatus discussed above in accordance with one embodiment of the present invention, is described below with reference to FIG. 5.

The external voltage VDD is applied to the semiconductor memory apparatus. The level of the external voltage VDD increases, and when the increasing level of the external voltage VDD becomes higher than a voltage level preset in the external voltage level detector 10, the external voltage detection signal det_vd is enabled.

If the external voltage detection signal det_vd is enabled, the band gap voltage generation unit 20 generates the band gap voltage V_bg. The level of the band gap voltage V_bg increases, and when the increasing level of the band gap voltage V_bg becomes higher than a target voltage level preset in the band gap voltage level detector 110, the band gap detection signal det_bg is enabled.

If the band gap detection signal det_bg is enabled, the external voltage VDD is transferred to the voltage dividing section 130 as the transfer voltage V_tr. The transfer voltage V_tr is divided by the voltage dividing section 130 and is outputted as the division voltage V_dv.

When the level of the band gap voltage V_bg is higher than the level of the division voltage V_dv, the power-on reset signal POR_signal is enabled, and when the level of the band gap voltage V_bg is lower than the level of the division voltage V_dv, the power-on reset signal POR_signal is disabled.

In the power-on reset signal generation circuit of semiconductor memory apparatus in accordance with one embodiment of the present invention, since the division voltage V_dv is generated after the band gap voltage V_bg reaches the target level, the power-on reset signal POR_signal can be normally generated, unlike a typical semiconductor memory apparatus. That is to say, it is possible to prevent the power-on reset signal POR_signal from being generated as in the case b) of FIG. 2.

As a result, in the power-on reset signal generation circuit of a semiconductor memory apparatus in accordance with one embodiment of the present invention, since the power-on reset signal POR_signal can be normally generated, it is possible to prevent an initial driving error from being caused in the semiconductor memory apparatus and the reliability of the semiconductor memory apparatus is improved.

In FIG. 4, the band gap voltage level detector 110 for detecting the level of the band gap voltage V_bg may be, for example, an inverter comprising the transistors P11 and N11. The voltage transfer switching section 120 may comprise the transistor P12. Therefore, if the level of the band gap voltage V_bg becomes identical to or greater than the target voltage level, the voltage level of the band gap detection signal det_bg may be reduced to a level that turns on the transistor P12 of the voltage transfer switching section 120.

However, since the band gap voltage level detector 110 may be an inverter, it is vulnerable to changes in process, voltage and temperature (PVT). If the level of the external voltage VDD applied as the driving voltage of the band gap voltage level detector 110 becomes lower than that in a normal case, the voltage level of the band gap detection signal det_bg may turn on the transistor P12 of the voltage transfer switching section 120 even though the voltage level of the band gap voltage V_bg does not reach the target level.

As a result, as the division voltage V_dv is outputted with the voltage level of the band gap voltage V_bg not reaching the target level, the power-on reset signal POR_signal may be abnormally generated as described above.

A band gap level detector capable of normally turning on the voltage transfer switching section 120 by detecting the voltage level of the band gap voltage V_bg irrespective of changes in PVT is described, and then operations for generating the power-on reset signal POR_signal using the same are explained.

Figure 6:
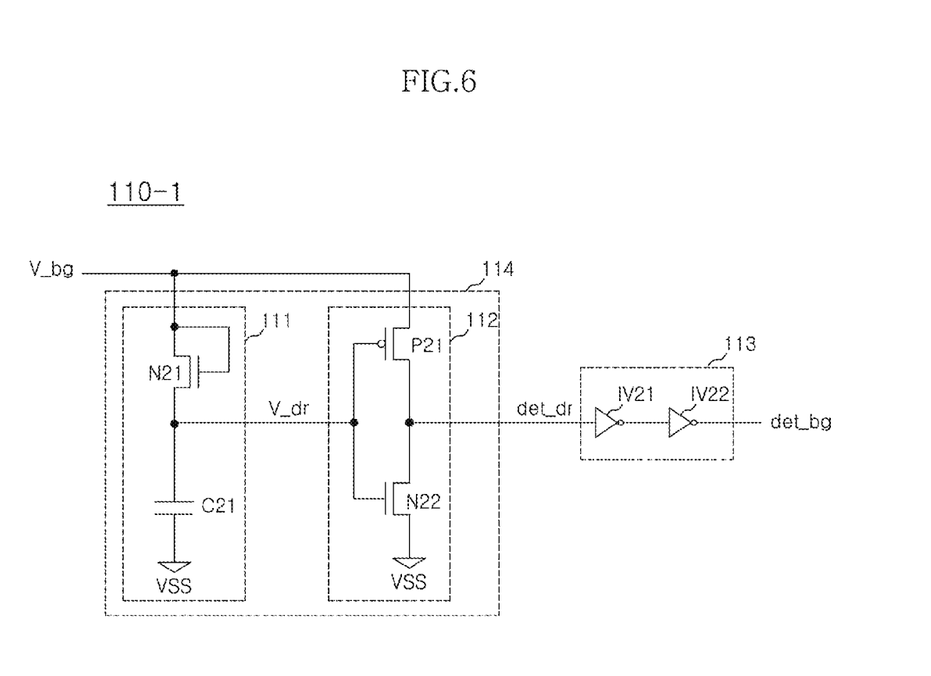
FIG. 6 is a diagram illustrating a band gap voltage level detector shown in FIG. 4.

A power-on reset signal generation circuit of semiconductor memory apparatus in accordance with one embodiment of the present invention may be, for example, a band gap voltage level detector 110-1 shown in FIG. 6.

Referring to FIG. 6, the band gap voltage level detector 110-1 comprises a voltage dropping part 111, a level detecting part 112, and a driving part 113.

The voltage dropping part 111 drops the band gap voltage V_bg and generates a drop voltage V_dr. Also, the voltage dropping part 111 constantly maintains a difference in the levels of the band gap voltage V_bg and the drop voltage V_dr.

The voltage dropping part 111 comprises a fourth transistor N21 and a capacitor C21. The fourth transistor N21 has a gate and a drain which are inputted with the band gap voltage V_bg. The capacitor C21 has one end to which a source of the fourth transistor N21 is connected and the other end to which the ground terminal VSS is connected. The fourth transistor N21, which has the gate and the drain connected to each other, performs the same function as a conventional diode. Thus, the fourth transistor N21, which has the gate and the drain connected with each other, may be referred to as a diode type transistor.

Since the fourth transistor N21 has the drain and the gate which are commonly inputted with the band gap voltage V_bg, if the level of the band gap voltage V_bg rises, the turn-on level of the fourth transistor N21 increases and the fourth transistor N21 raises the level of the drop voltage V_dr. Meanwhile, if the level of the band gap voltage V_bg falls, the turn-on level of the fourth transistor N21 is decreased and the fourth transistor N21 reduces the level of the drop voltage V_dr.

The level detecting part 112 is applied with the band gap voltage V_bg and a ground voltage VSS as driving voltages. The level detecting part 112 enables a drop detection signal det_dr to the level of the ground voltage VSS when the drop voltage V_dv becomes identical to or greater than a target voltage level, and disables the drop detection signal det_dr to the level of the band gap voltage V_bg when the drop voltage V_dr becomes less than the target voltage level.

The level detecting part 112 comprises fifth and sixth transistors P21 and N22. The fifth transistor P21 has a source to which the band gap voltage V_bg is applied and a gate which is inputted with the drop voltage V_dr. The sixth transistor N22 has a drain to which the drain of the fifth transistor P21 is connected, a gate which is inputted with the drop voltage V_dr, and a source to which the ground terminal VSS is connected. At this time, the drop detection signal det_dr is outputted from a node to which the fifth and sixth transistors P21 and N22 are connected. Since the voltage dropping part 111 and the level detecting part 112 detect the level of the band gap voltage V_bg and generate the drop detection signal det_dr that transits to the level of the band gap voltage V_bg or the level of the ground voltage VSS, they may be referred to as a detection signal generation block 114.

The driving part 113 drives the drop detection signal det_dr and generates a band gap detection signal det_bg that transits to the level of an external voltage VDD (not shown) or the level of the ground voltage VSS.

The driving part 113 comprises first and second inverters IV21 and IV22. The first inverter IV21 is inputted with the drop detection signal det_dr. The second inverter IV22 is inputted with the output signal of the first inverter IV21 and generates the band gap detection signal det_bg. Although not shown in the drawing, the first and second inverters IV21 and IV22 may be driven by being applied with the external voltage VDD and the ground voltage VSS.

The band gap voltage level detector 110-1 configured as mentioned above operates as described below.

As shown in FIG. 6, since the fourth transistor N21 of the voltage dropping part 111 has the drain and the gate which are commonly inputted with the band gap voltage V_bg, if the level of the band gap voltage V_bg rises, the turn-on level of the fourth transistor N21 is increased and the fourth transistor N21 raises the level of the drop voltage V_dr. Meanwhile, if the level of the band gap voltage V_bg falls, the turn-on level of the fourth transistor N21 is decreased and the fourth transistor N21 lowers the level of the drop voltage V_dr. Accordingly, a difference in the levels of the band gap voltage V_bg and the drop voltage V_dr is maintained.

If the level of the drop voltage V_dr becomes higher than the target voltage level, the sixth transistor N22 is turned on, and the drop detection signal det_dr is enabled to the level of the ground voltage VSS. Meanwhile, if the level of the drop voltage V_dr becomes lower than the target voltage level, the fifth transistor P21 is turned on, and the drop detection signal det_dr is enabled to the level of the band gap voltage V_bg.

The drop detection signal det_dr enabled to the level of the ground voltage VSS is driven through the driving part 113 and is outputted as the band gap detection signal det_bg that is enabled to the level of the ground voltage VSS.

The drop detection signal det_dr enabled to the level of the band gap voltage V_bg is driven through the driving part 113 and is outputted as the band gap detection signal det_bg that is disabled to the level of the external voltage VDD.

If the band gap detection signal V_bg is enabled, as shown in FIG. 4, the external voltage VDD is outputted as the transfer voltage V_tr, and the transfer voltage V_tr is divided and outputted as the division voltage V_dv. Meanwhile, if the band gap detection signal V_bg is disabled, the output of the external voltage VDD as the transfer voltage V_tr is interrupted.

In such a case that the external voltage VDD is outputted as the transfer voltage V_tr, the transfer voltage V_tr is divided and outputted as the division voltage V_dv.

By comparing the levels of the band gap voltage V_bg and the division voltage V_dv, the power-on reset signal POR_signal is generated.

In the power-on reset signal generation circuit of a semiconductor memory apparatus in accordance with one embodiment of the present invention, since the band gap level detector for detecting the level of the band gap voltage is configured as shown in FIG. 6 to not be influence by the external voltage, the power-on reset signal can be stably generated.

Figure 7:
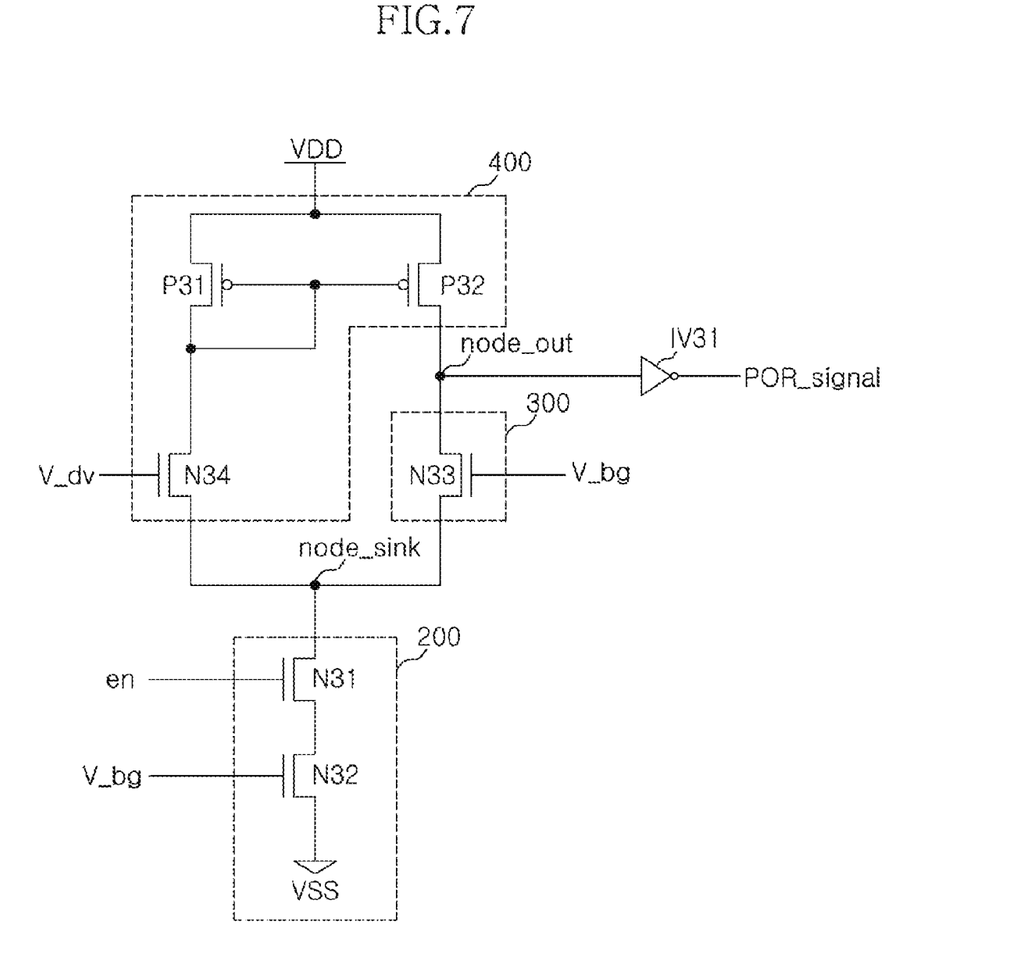
FIG. 7 is a diagram schematically illustrating a power-on reset signal generation circuit of a semiconductor memory apparatus in accordance with one embodiment of the present invention.

Referring to FIG. 7, a power-on reset signal generation circuit of a semiconductor memory apparatus in accordance with one embodiment of the present invention comprises an activation control unit 200, a first switching unit 300, and a second switching unit 400. A division voltage V_dv represents the voltage generated by the voltage dividing unit 30 shown in FIG. 1, and a band gap voltage V_bg represents the voltage generated by the configurations of the external voltage level detector 10 and the band gap voltage generation unit 20 shown in FIG. 1.

The activation control unit 200 connects a sink node node_sink with a ground terminal VSS when an enable signal en is enabled and the band gap voltage V_bg becomes higher than a target voltage level.

The activation control unit 200 comprises a seventh transistor N31 and an eighth transistor N32. The seventh transistor N31 has a gate which is inputted with the enable signal en and a drain to which the sink node node_sink is connected. The eighth transistor N32 has a gate which is inputted with the band gap voltage V_bg, a drain to which the source of the seventh transistor N31 is connected, and a source to which the ground terminal VSS is connected.

The first switching unit 300 connects the sink node node_sink to an output node node_out when the sink node node_sink is connected to the ground terminal VSS and the band gap voltage V_bg is higher than the level of the division voltage V_dv.

The first switching section 300 comprises a ninth transistor N33. The ninth transistor N33 has a gate which is inputted with the band gap voltage V_bg a drain to which the output node node_out is connected, and a source to which the sink node node_sink is connected.

The second switching unit 400 applies the external voltage VDD to the output node node_out when the sink node node_sink is connected to the ground terminal VSS and the band gap voltage V_bg is lower than the level of the division voltage V_dv.

The second switching unit 400 comprises tenth through twelfth transistors N34, P31 and P32. The tenth transistor N34 has a gate which is inputted with the division voltage V_dv and a source to which the sink node node_sink is connected. The eleventh transistor P31 has a source which is inputted with the external voltage VDD and a drain and a gate to which the drain of the tenth transistor N34 is connected. The twelfth transistor P32 has a gate to which the drain of the tenth transistor N34 is connected, a source which is inputted with the external voltage VDD, and a drain to which the output node node_out is connected.

The voltage of the output node node_out is outputted as the voltage level of the power-on reset signal POR_signal through an inverter IV31.

The power-on reset signal generation circuit of a semiconductor memory apparatus in accordance with one embodiment of the present invention operates as described below.

If the enable signal en is enabled to a high level, the seventh transistor N31 is turned on. If the level of the band gap voltage V_bg rises to a level capable of turning on the eighth transistor N32, the sink node node_sink and the ground terminal VSS are connected to each other through the seventh transistor N31 and the eighth transistor N32.

If the sink node node_sink and the ground terminal VSS are connected to each other, the voltage level of the output node node_out is changed by comparing the levels of the division voltage V_dv and the band gap voltage V_bg.

For example, if the level of the band gap voltage V_bg is higher than the level of the division voltage V_dv, the turn-on degree of the ninth transistor N33 becomes greater than the turn-on degree of the tenth transistor N34, and the voltage level of the output node node_out is lowered.

If the level of the band gap voltage V_bg is lower than the level of the division voltage V_dv, the turn-on degree of the tenth transistor N34 becomes greater than the turn-on degree of the ninth transistor N33, and due to this fact, if the twelfth transistor P32 is turned on, the voltage level of the output node node_out is raised.

As a result, if the sink node node_sink and the ground terminal VSS are connected and the level of the band gap voltage V_bg becomes higher than the level of the division voltage V_dv, the output node node_out and the sink node node_sink are connected by the first switching unit 300, and the voltage level of the output node node_out is lowered. Also, if the sink node node_sink and the ground terminal VSS are connected and the level of the band gap voltage V_bg becomes lower than the level of the division voltage V_dv, the external voltage VDD is applied to the output node node_out by the second switching unit 400, and the voltage level of the output node node_out is raised.

The voltage level of the output node node_out is outputted as the power-on reset signal POR_signal through the inverter IV31. If the sink node node_sink is connected to the output node node_out, the power-on reset signal POR_signal is enabled to a high level through the inverter IV31, and if the external voltage VDD is applied to the output node node_out, the power-on reset signal POR_signal is disabled to a low level through the inverter IV31.

Unlike in a typical semiconductor memory apparatus where the levels of the band gap voltage and the division voltage are compared even though the band gap voltage does not reach the target voltage level, as shown in the case b) of FIG. 2, in the power-on reset signal generation circuit of a semiconductor memory apparatus in accordance with one embodiment of the present invention, comparison between the division voltage and the band gap voltage is started only when the level of the band gap voltage becomes identical to or greater than the target voltage level, and the power-on reset signal is generated as a result of the comparison.

As is apparent from the above descriptions, the power-on reset signal generation circuit of a semiconductor memory apparatus provides advantages in that, since a power-on reset signal can be normally generated, it is possible to prevent an initial driving error from occurring in the semiconductor memory apparatus, and the reliability of the semiconductor memory apparatus is improved.

While certain embodiments have been described above, it will be understood to those skilled in the art that the embodiments described are by way of example only. Accordingly, the power-on reset signal generation circuit of a semiconductor memory apparatus described herein should not be limited based on the described embodiments. Rather, the power-on reset signal generation circuit of a semiconductor memory apparatus described herein should only be limited in light of the claims that follow when taken in conjunction with the above description and accompanying drawings.

What is claimed is:

1. A power-on reset signal generation circuit of a semiconductor memory apparatus, comprising:
    an external voltage level detector configured to detect an external voltage and generate an external voltage detection signal;
    a band gap voltage generation unit configured to generate a band gap voltage in response to the external voltage detection signal;
    a level detection voltage dividing unit configured to divide the external voltage depending upon a level of the band gap voltage and generate a division voltage; and
    a power-on reset signal generation unit configured to compare the level of the band gap voltage with a level of the division voltage and generate a power-on reset signal,
    wherein the level detection voltage dividing unit comprises:
        a band gap voltage level detector configured to detect the level of the band gap voltage and generate a band gap detection signal;
        a voltage transfer switching section configured to output the external voltage as a transfer voltage in response to the band gap detection signal; and
        a voltage dividing section configured to divide the transfer voltage and generate the division voltage,
    wherein the band gap voltage level detector comprises:
        a voltage dropping part configured to drop the level of the band gap voltage and generate a drop voltage;
        a level detecting part configured to generate a drop detection signal in response to a level of the drop voltage; and
        a driving part configured to drive the drop detection signal and output it as the band gap detection signal; and
    wherein the level detecting part is configured to be applied with the band gap voltage to its positive power supply terminal and enable the drop detection signal when the drop voltage is higher than a target level.

2. The power-on reset signal generation circuit according to claim 1, wherein the band gap voltage level detector is configured to enable the band gap detection signal when the band gap voltage has a voltage level higher than a target level.

3. The power-on reset signal generation circuit according to claim 1, wherein the voltage dropping part substantially maintains a difference between the levels of the band gap voltage and the drop voltage.

4. The power-on reset signal generation circuit according to claim 1, wherein the voltage transfer switching section is configured to output the external voltage as the transfer voltage when the band gap detection signal is enabled, and suppress the external voltage from being outputted as the transfer voltage when the band gap detection signal is disabled.

5. The power-on reset signal generation circuit according to claim 1, wherein the power-on reset signal generation unit is configured to enable the power-on reset signal when the level of the band gap voltage is higher than the level of the division voltage, and disable the power-on reset signal when the level of the band gap voltage is lower than the level of the division voltage.

6. The power-on reset signal generation circuit according to claim 1, wherein the external voltage level detector is configured to enable the external voltage detection signal when a level of the external voltage is higher than a target level, and generate the band gap voltage when the external voltage detection signal is enabled.

7. A power-on reset signal generation circuit of a semiconductor memory apparatus, comprising:
    a voltage dividing unit configured to divide an external voltage and generate a division voltage; and
    a power-on reset signal generation unit configured to compare a level of a band gap voltage with a level of division voltage and generate a power-on reset signal when an enable signal is enabled and the level of the band gap voltage is higher than a target level,
    wherein the power on reset signal generation unit comprises:
        an activation control unit configured to connect a ground terminal to a sink node when the enable signal is enabled and the level of the band gap voltage is higher than the target level;
        a first switching unit configured to connect the sink node to an output node when the ground terminal is connected to the sink node and the level of the band gap voltage is higher than the level of the division voltage; and
        a second switching unit configured to connect the external voltage to the output node when the ground terminal is connected to the sink node and the level of the band gap voltage is higher than the level of the division voltage.

* * * * *